United States Patent
Zeng et al.

(10) Patent No.: US 9,666,757 B2
(45) Date of Patent: May 30, 2017

(54) VERTICAL LIGHT EMITTING DIODE AND FABRICATION METHOD

(71) Applicant: XIAMEN SANAN OPTOELECTRONICS TECHNOLOGY CO., LTD., Xiamen (CN)

(72) Inventors: Xiaoqiang Zeng, Xiamen (CN); Chih-Wei Chao, Xiamen (CN); Shunping Chen, Xiamen (CN); Jianjian Yang, Xiamen (CN); Daquan Lin, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/588,001

(22) Filed: Dec. 31, 2014

(65) Prior Publication Data

US 2015/0108534 A1    Apr. 23, 2015

Related U.S. Application Data

(63) Continuation of application No. PCT/CN2013/083895, filed on Sep. 22, 2013.

(30) Foreign Application Priority Data

Sep. 24, 2012 (CN) .......................... 2012 1 0355335

(51) Int. Cl.
*H01L 33/00* (2010.01)
*H01L 33/14* (2010.01)
*H01L 33/36* (2010.01)
*H01L 33/20* (2010.01)
*H01L 33/38* (2010.01)

(52) U.S. Cl.
CPC .......... *H01L 33/145* (2013.01); *H01L 33/005* (2013.01); *H01L 33/0079* (2013.01); *H01L 33/20* (2013.01); *H01L 33/36* (2013.01); *H01L 33/38* (2013.01); *H01L 2933/0016* (2013.01)

(58) Field of Classification Search
CPC ....... H01L 33/20; H01L 33/24; H01L 33/145; H01L 33/38
See application file for complete search history.

(56) References Cited

U.S. PATENT DOCUMENTS

| | | | | |
|---|---|---|---|---|
| 5,661,042 A * | 8/1997 | Fang | ....................... | G01R 1/073 156/325 |
| 5,965,064 A * | 10/1999 | Yamada | ..................... | C09J 9/02 174/259 |
| 2007/0290215 A1* | 12/2007 | Kato | ................... | H01L 33/0079 257/79 |
| 2010/0032701 A1* | 2/2010 | Fudeta | .................... | H01L 33/46 257/98 |

* cited by examiner

*Primary Examiner* — Khiem D Nguyen
(74) *Attorney, Agent, or Firm* — Syncoda LLC; Feng Ma; Junjie Feng

(57) ABSTRACT

A vertical LED with current blocking structure and its associated fabrication method involve an anisotropic conductive material and a conductive substrate with concave-convex structure. The anisotropic conductive material forms a bonding layer with vertical conduction and horizontal insulation between the concave-convex substrate and the light-emitting epitaxial layer, thereby forming a vertical LED with current blocking function.

13 Claims, 10 Drawing Sheets

VERTICAL LIGHT EMITTING DIODE AND FABRICATION METHOD

CROSS-REFERENCE TO RELATED APPLICATIONS

The present application is a continuation of, and claims priority to, PCT/CN2013/083895 filed on Sep. 22, 2013, which claims priority to Chinese Patent Application No. 201210355335.6 filed on Sep. 24, 2012. The disclosures of these applications are hereby incorporated by reference in their entirety.

BACKGROUND

In recent years, vertical LED has become a hot topic for research and development. In comparison to traditional standard and flip-chip structures, the vertical LED, with the combination of techniques such as wafer bonding, electroplating or laser lift-off (LLO), allows transfer of the epitaxial layer from the growth substrate to metal or semiconductor substrate with good electric-conduction and heat-conduction performance. The resulting upper and lower electrode distribution and vertical current injection can overcome a series of problems such as poor heat dissipation, uneven current distribution, poor reliability due to horizontal electrode distribution and side injection of current in the standard and flip-chip structure LED elements.

In fabrication of traditional vertical LEDs, the wafer bonding is made by applying high pressure and high temperature on the metal. More specifically, the process may include bonding the epitaxial layer coated with Au, Au—Sn, or other easily-bonded metal on the conductive substrate, similarly coated with metal; removing the growth substrate, and fabricating the N electrode to form the vertical LED. FIG. 1 is a schematic diagram for the vertical LED structure according to the above method, wherein the N electrode is at the top, which will block and absorb the light emitted from the active layer.

SUMMARY

The present disclosure provides a vertical LED with current blocking function and its associated fabrication method. With the combination of characteristic of the anisotropic conductive material and the conductive substrate with concave-convex structure, the anisotropic conductive material forms a bonding layer with vertical conduction and horizontal insulation between the concave-convex substrate and the light-emitting epitaxial layer, thereby forming a vertical LED with current blocking function.

According to a first aspect of the present disclosure, a vertical LED with current blocking function, comprising: a conductive substrate, which includes a front and a back main surface, wherein, the front surface has a patterned concave-convex structure; an anisotropic conductive material layer, on the front surface of the conductive substrate with concave-convex structure, which forms electrical connection with the convex portion of the conductive substrate and non-electrical connection with the concave portion of the conductive substrate, thereby forming a current blocking structure; and a light emitting epitaxial structure formed over the anisotropic conductive material layer.

Further, the LED also comprises an electrode structure on the surface of the light-emitting epitaxial layer, which projects at the normal direction and corresponds to the concave portion of the conductive substrate. In some preferable embodiments of the present disclosure, the concave-convex structure of the conductive substrate is an array structure and all the convex portions are level on the surface.

The anisotropic conductive material layer is conductive at vertical direction and insulated at horizontal direction.

According to a second aspect of the present disclosure, a fabrication method for a vertical LED with current blocking function, comprising: 1) providing a permanent conductive substrate and growing a patterned concave-convex structure on the front surface; 2) providing a light-emitting epitaxial layer; 3) bonding the light-emitting epitaxial layer via an anisotropic conductive material layer to the permanent conductive substrate; wherein, the anisotropic conductive material layer forms electrical connection with the convex portion of the conductive substrate and forms non-electrical connection with the concave portion of the conductive substrate, thus forming a current blocking structure.

In one embodiment of the present disclosure, Step 3) can also be realized by the following method: coat an anisotropic conductive material layer evenly over the epitaxial layer; use wafer bonding equipment to bond the light-emitting epitaxial layer with the permanent conductive substrate. After the anisotropic conductive material layer is pressed by the conductive substrate concave-convex structure, at the convex position of the substrate, the epitaxial layer is conductive with the conductive substrate, and at the concave position of the substrate, the ACF (Anisotropic Conductive-adhesive Film) is under insulating status and be filled with devices. The bonding pressure is sufficient to make the ACF contacted with the convex portion of the conductive substrate under vertical conductive status and the ACF contacted with the concave portion of the conductive substrate under insulated status.

In another embodiment of the present disclosure, Step 3) can also be realized by the following method: coat an anisotropic conductive material layer over the front surface of the conductive substrate; use wafer bonding equipment to bond the light-emitting epitaxial layer and the permanent conductive substrate, wherein, the bonding pressure is sufficient to make the ACF contacted with the convex portion of the conductive substrate under vertical conductive status and the ACF contacted with the concave portion of the conductive substrate under insulated status.

According to the fabrication method of the present disclosure, in Step 1): the conductive substrate is patterned into an array-distributed pattern or a pattern with size equivalent to the size of the N-type electrode; after Step 3), a Step 4) is also included as follows: fabricate a first electrode structure at the end of the light-emitting epitaxial layer far from the conductive substrate, which projects at normal direction and corresponds to the concave portion of the conductive substrate; in addition, it can also include thinning of the conductive substrate, fabrication of the back electrode, roughening of the light-emitting surface, fabrication of the passivation layer, fabrication of the current blocking layer, etc.

In comparison to traditional vertical chip, in this present disclosure, with the combination of characteristic of the anisotropic conductive material and the conductive substrate with concave-convex structure, the anisotropic conductive material forms a bonding layer with vertical conduction and horizontal insulation between the concave-convex substrate and the light-emitting epitaxial layer, forming a vertical LED with current blocking function, thereby overcoming current blocking problem. The fabrication is also characterized by simple fabrication and high stability.

100: growth substrate; 101: P-type layer; 102: active layer; 103: N-type layer; 200: conductive substrate; 201: convex portion; 202: concave portion; 310: bonding metal layer; 320: ACF; 321: insulation paste; 322: conductive particle; 320a: ACF conduction portion; 320b: ACF insulation portion; 410: P electrode; 420: N electrode; 421: N electrode expansion strip.

DETAILED DESCRIPTION

The following embodiments disclose a vertical LED with current blocking function and fabrication method, wherein, the LED comprises a conductive substrate, on the front surface of which formed a patterned concave-convex structure; an anisotropic conductive material layer, formed on the front surface of the conductive substrate, which is conductive with the convex portion and insulated with the concave portion of the substrate; a light-emitting epitaxial layer, formed over the anisotropic conductive material layer, comprising bottom-up a P-type layer, an active layer and an N-type layer; an N electrode, formed on the N-type layer; and a P electrode, formed on the opposite surface of the conductive substrate.

Figure 1:
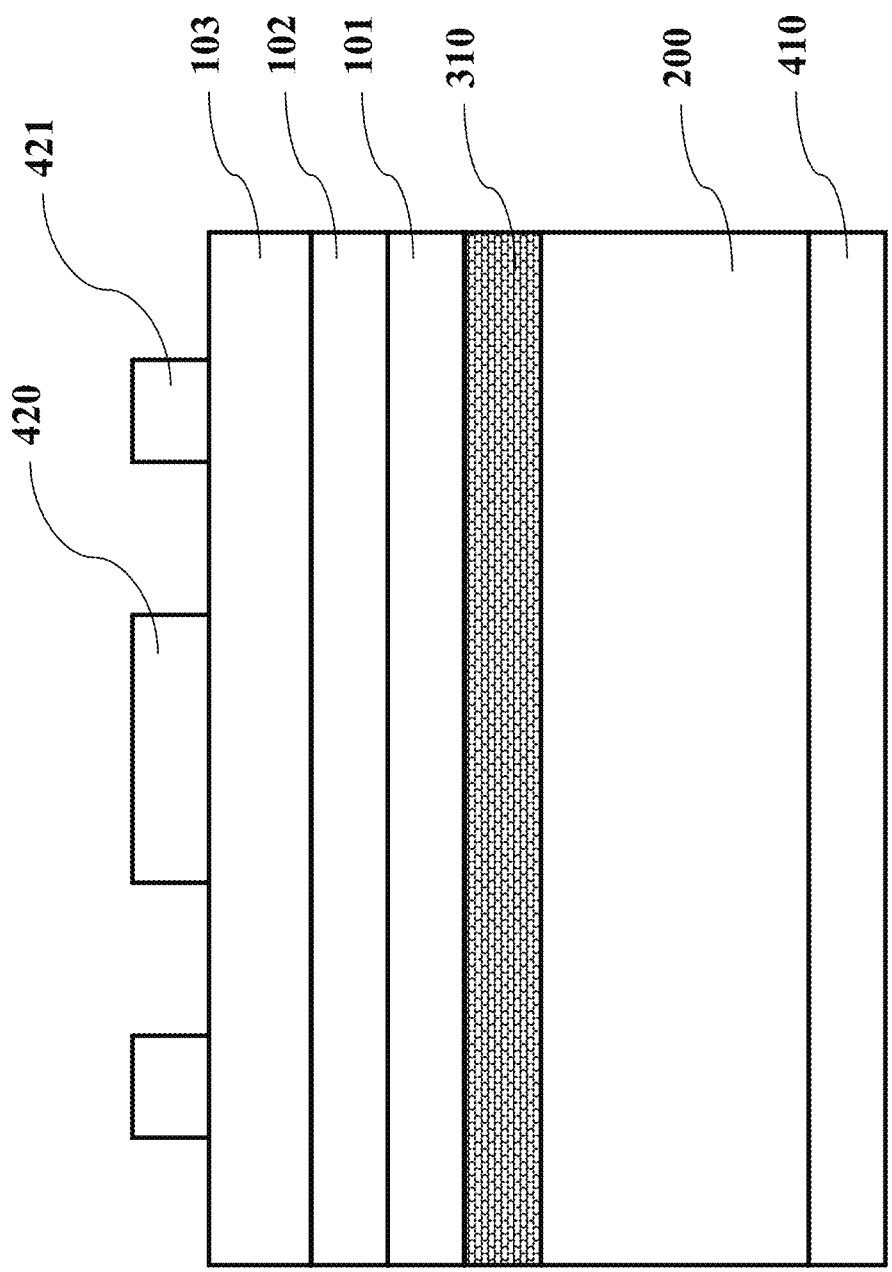
FIG. 1 is a side sectional view of a conventional vertical light emitting element.
Figure 2:
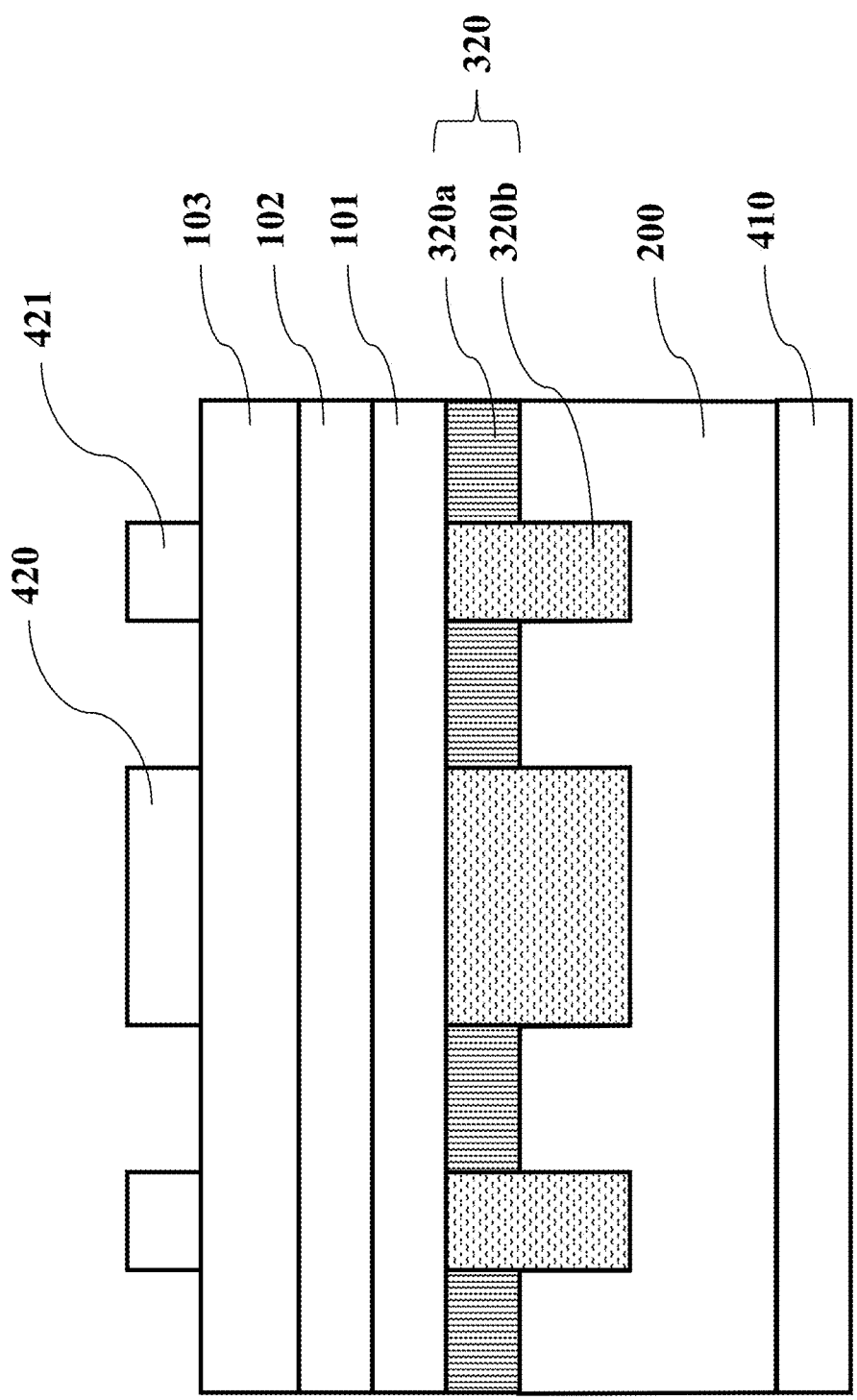
FIG. 2 is a side sectional view of a preferred embodiment of the present disclosure.

As shown in FIG. 2, a vertical LED with current blocking function, comprising a patterned permanent conductive substrate 200 with the concave-convex structure; an ACF 320 over the front surface of the substrate; wherein, a P-type epitaxial layer 101, an active layer 102 and an N-type epitaxial layer 103 successively form on the ACF 320, forming a light-emitting epitaxial layer; a P electrode 410 over the back surface of the permanent conductive substrate 200, an N-type electrode 420 and an expansion structure 421 above the N-type epitaxial layer.

Figure 3:
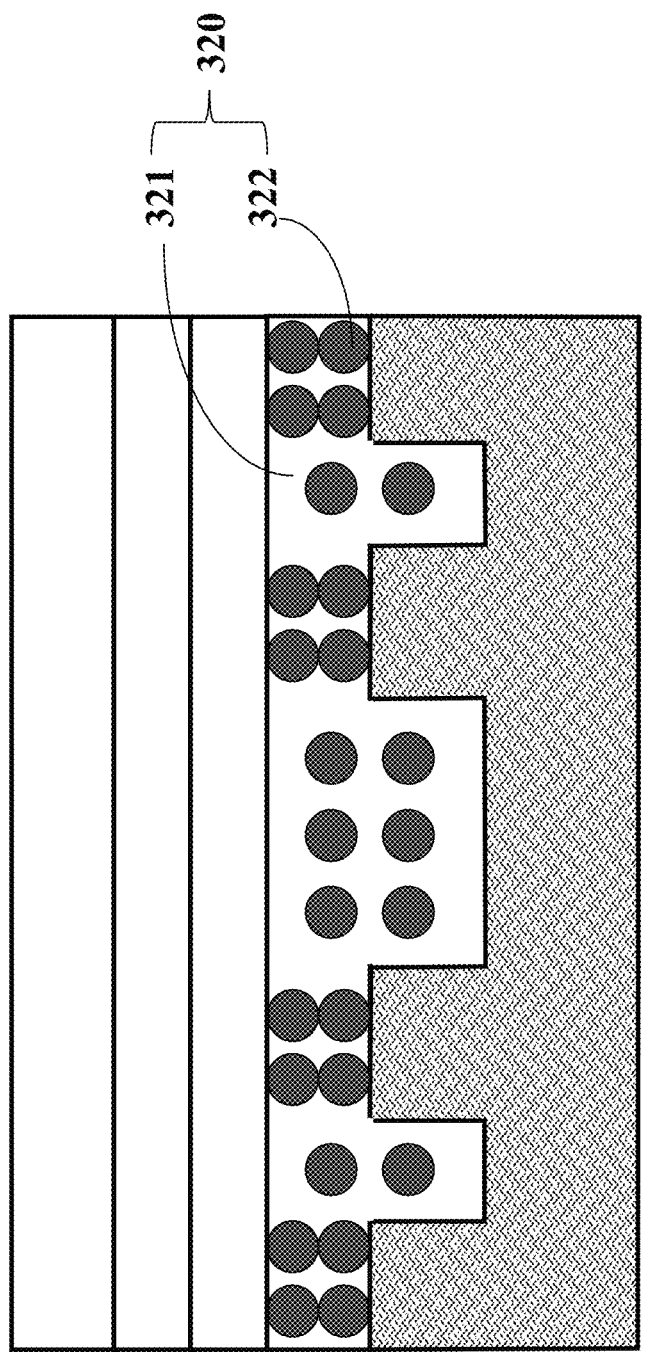
FIG. 3 is a schematic diagram of the components and principles of the anisotropic conductive material layer.

The ACF is a macromolecule connection material with adhesion, conduction and insulation features. It is characterized in that it is conductive at the film thickness direction and is not conductive at the surface direction (i.e., conductive at vertical direction and insulated at horizontal direction). In general, the ACF comprises conductive particles 322 and insulation paste 321, wherein, the conductive particles are evenly distributed within the insulation paste. After a certain period of heating and pressing for the ACF, the conductive particles inside the insulation paste contact with each other, and the insulation paste, due to high temperature curing, permanently fixes the bonding status of the conductive particles, forming a stable structure of the ACF as conductive at vertical direction (pressing direction) and insulated at horizontal direction. In this embodiment, as shown in FIG. 3, the ACF 320 is divided into a conduction portion 320a and an insulation portion 320b. The conduction portion 320a is a conductive structure with the ACF 320 passing through the convex portion of the conductive substrate to make the conductive particles 322 contacted with each other via pressing; and the insulation portion 320b is the ACF 320 in which the conductive particles 322 have not yet completely contacted till conductive, which fills in the concave portion of the conductive substrate.

Detailed descriptions will be given to the vertical LED with current blocking function in this present disclosure with reference to FIGS. 4-8.

Figure 4:
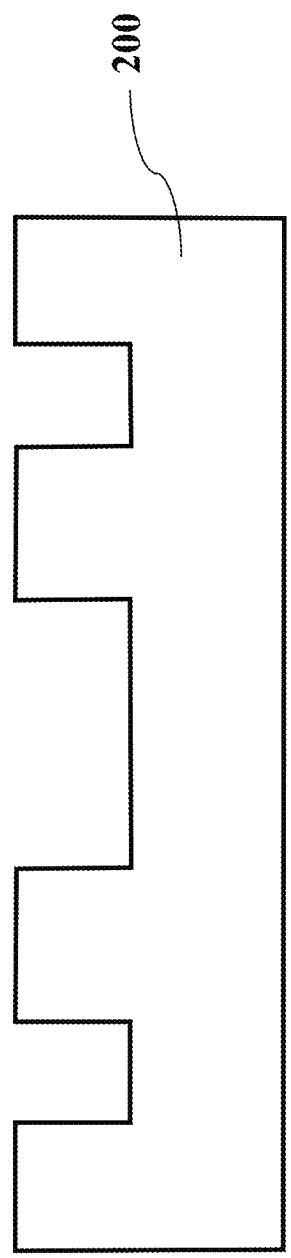
FIG. 4 illustrates a first step of a fabrication process according to some embodiment.
Figure 9:
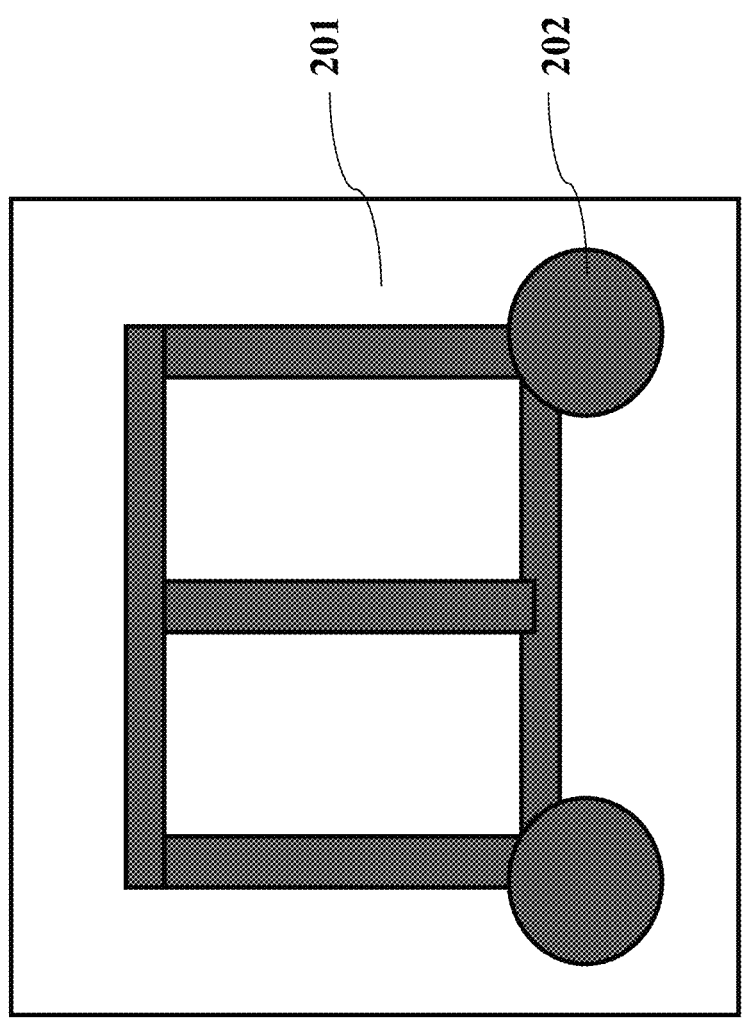
FIG. 9 illustrates a concave-convex pattern of the conductive substrate according to some embodiments.
Figure 10:
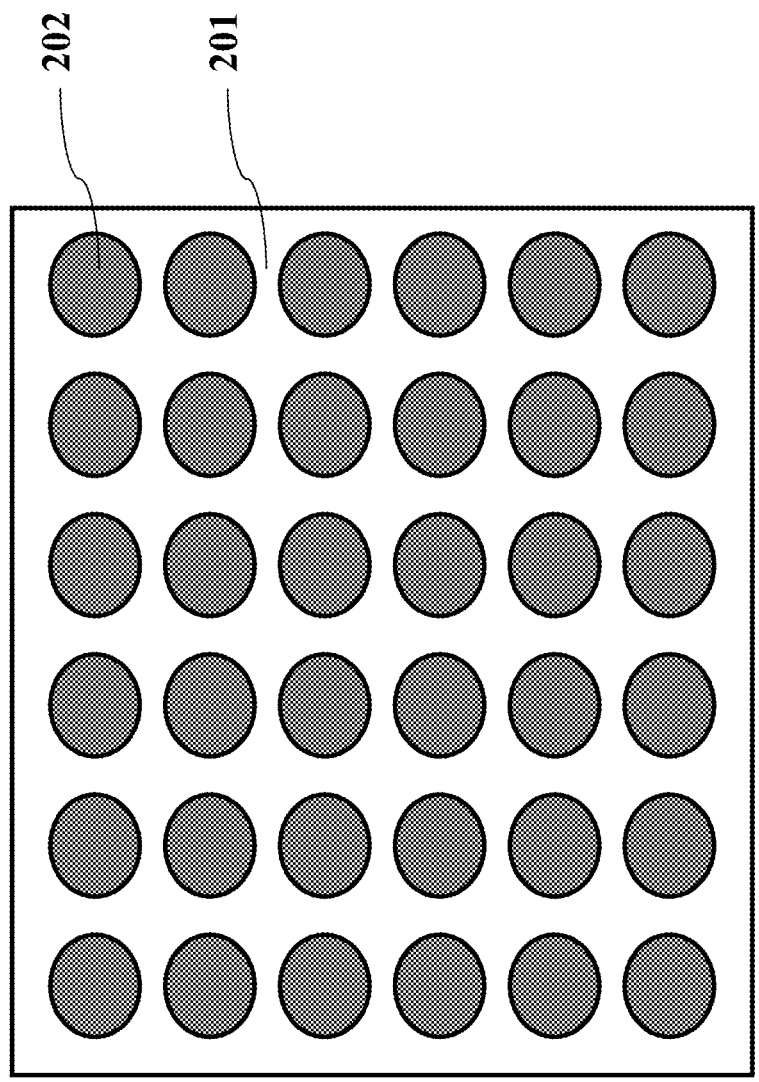
FIG. 10 illustrates another pattern.

As shown in FIG. 4, provide a permanent conductive substrate 200 and form patterning via yellow light lithography technology. Etch the substrate to form a concave-convex structure with at least 10 μm of etching depth (preferable depth: 30 μm). FIG. 9 shows a top structural view of the conductive substrate 200 with concave-convex structure corresponding to the N-type electrode, wherein, the gray part is the concave portion, and the rest part is the convex portion; FIG. 10 shows a top structural view of an array-type conductive substrate 200 with concave-convex structure, wherein, the gray part is the concave portion, and the rest part is the convex portion.

Figure 5:
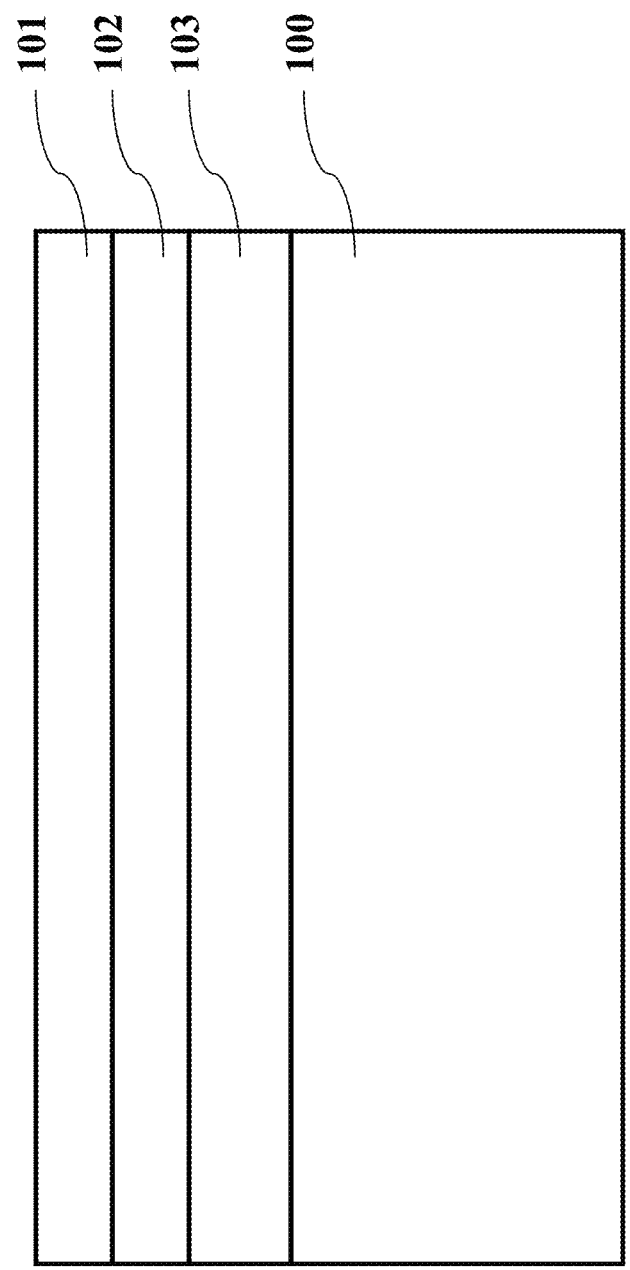
FIG. 5 illustrates a second step.

As shown in FIG. 5, grow an N-type layer 103, an active layer 102 and a P-type layer 101 via MOCVD on the growth substrate 100 (e.g., sapphire).

Figure 6:
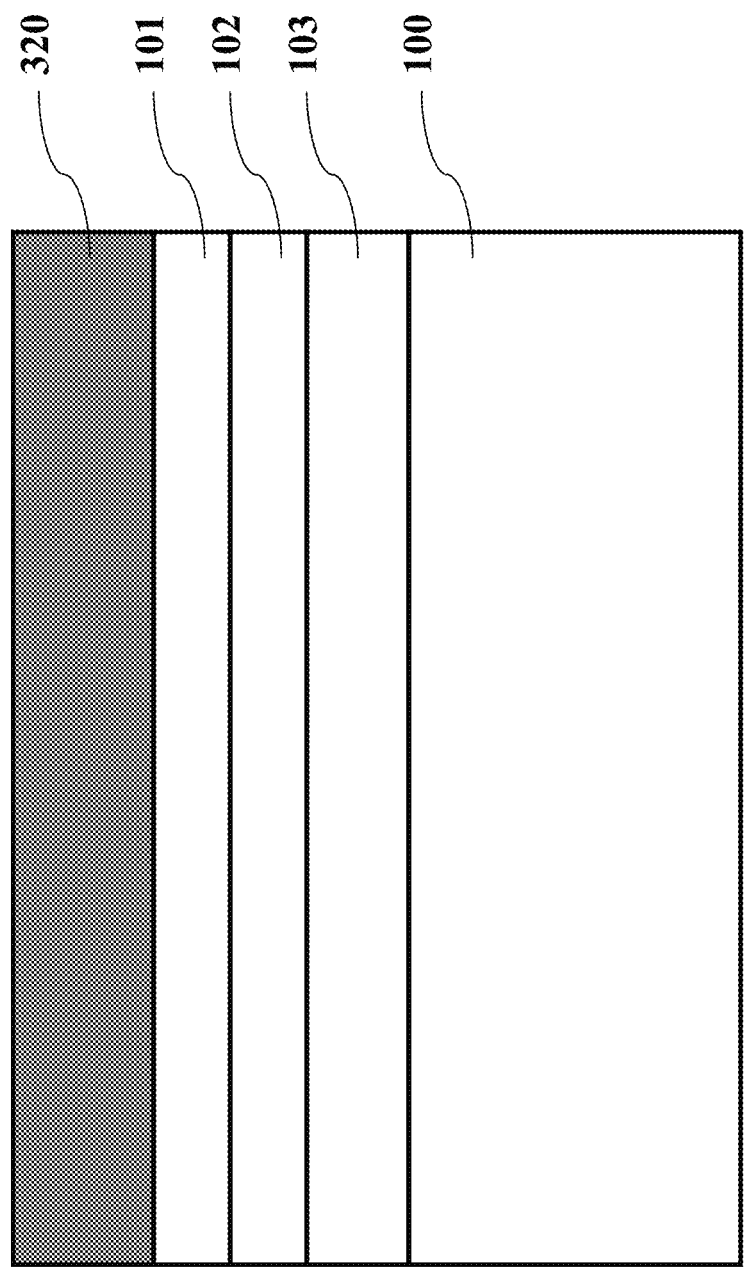
FIG. 6 illustrates a third step.

As shown in FIG. 6, coat an ACF 320 over the P-type layer 101 with the coating thickness not less than 30 μm, and preferable thickness 50 μm.

Figure 7:
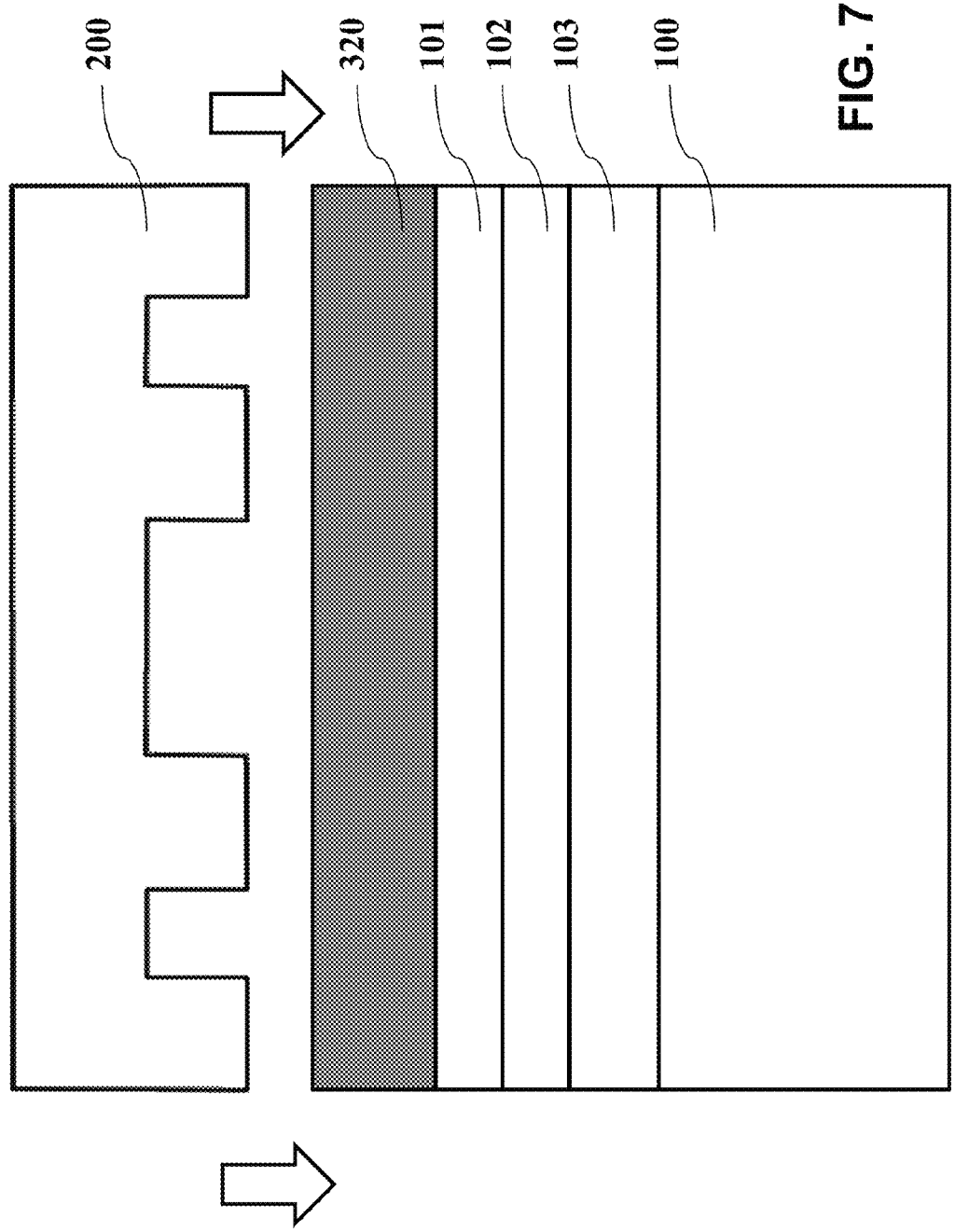
FIG. 7 illustrates a fourth step.

As shown in FIG. 7, fabricate a conductive substrate 200 with concave-convex structure and bond it to the epitaxial layer coated with the ACF 320 with the bonding pressure between 40 MPa and 60 MPa and bonding temperature preferable to be 200° C.

Figure 8:
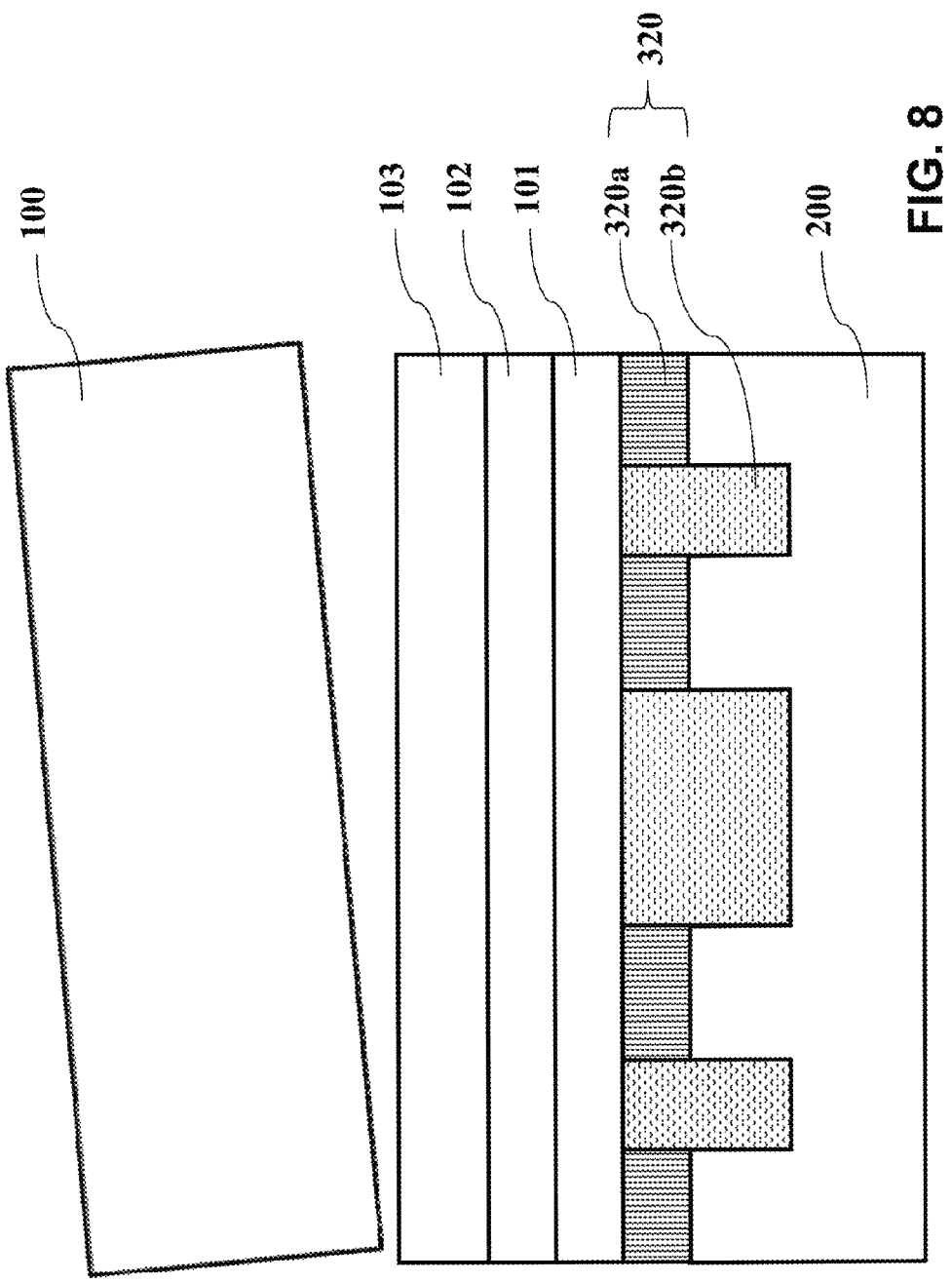
FIG. 8 illustrates a fifth step.

As shown in FIG. 8, adopt a 248 nm KrF excimer laser to lift off the growth substrate 100. Use hydrochloric acid to clean the remained Ga metal after laser lift-off. In this way, the N-type epitaxial layer 103 is exposed on the surface.

As shown in FIG. 3, fabricate an N-type electrode 420 and an expansion structure 421 on the N-type epitaxial layer 103. Specifically as follows: define the electrode and expansion strip area via photomask patterning. Use EBE evaporation coating to evaporate the N-type metal electrode 420 and the expansion portion 421. The metal layer may comprise one or several of Cr, Ag, Ni, Al, Pt, Au, Ti with total thickness not less than 1 μm and preferable thickness 2 μm.

A fabrication method for a vertical LED with current blocking function, comprising, roughening of the N-type epitaxial layer, fabrication of the passivation layer, etc.

In this embodiment, coat the ACF 320 over the light-emitting epitaxial layer and bond it with the concave-convex surface of the conductive substrate to simply obtain a current blocking structure. This fabrication is simple and the bonding yield is high as the bonding requirements are easily achieved; in addition, replacement of Au—Au bonding or Au—Sn bonding with ACF can greatly save the production cost without using precious metal.

The fabrication of the present disclosure is not limited to the above methods, which may also comprise coating the ACF 320 over the concave-convex surface of the conductive substrate and bonding it with the light-emitting epitaxial layer.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A vertical light emitting diode (LED), comprising:
a conductive substrate including a front surface and a back surface, wherein the front surface has a patterned concave-convex structure;
an anisotropic conductive material layer disposed over the front surface of the conductive substrate with the patterned concave-convex structure, and forming electrical coupling with a convex portion of the conductive substrate and non-electrical coupling with a concave portion of the conductive substrate, thereby forming a current blocking structure; and
a light emitting epitaxial structure formed over the anisotropic conductive material layer;
wherein the anisotropic conductive material layer is formed by distributing conductive particles in an insulating paste; and
wherein the anisotropic conductive material layer comprises:
a conductive portion corresponding to the convex portion, formed by having the conductive particles therein contacting each other thereby causing the conductive portion to be conductive at a vertical direction; and
an insulating portion corresponding to the concave portion, in which the conductive particles are substantially not in contact thereby causing the insulating portion to be insulative at a horizontal direction.

2. The LED of claim 1, further comprising an electrode structure formed over a top surface of the light-emitting epitaxial structure and having a projection at a normal direction corresponding to the concave portion of the conductive substrate.

3. The LED of claim 1, wherein the patterned concave-convex structure of the conductive substrate comprises an array structure, and wherein all convex portions have upper surfaces at a same level.

4. The LED of claim 1, wherein the anisotropic conductive material layer is conductive at the vertical direction relative to the front surface and insulative at the horizontal direction relative to the front surface.

5. The LED of claim 1, wherein the light emitting epitaxial structure comprises a first conductive semiconductor layer, an active layer, and a second conductive semiconductor layer.

6. A light emitting system including a plurality of vertical light emitting diodes (LEDs) each comprising:
a conductive substrate including a front surface and a back surface, wherein the front surface has a patterned concave-convex structure;
an anisotropic conductive material layer disposed over the front surface of the conductive substrate with the patterned concave-convex structure, and forming electrical coupling with a convex portion of the conductive substrate and non-electrical coupling with a concave portion of the conductive substrate, thereby forming a current blocking structure; and
a light emitting epitaxial structure formed over the anisotropic conductive material layer;
wherein the anisotropic conductive material layer is formed by distributing conductive particles in an insulating paste; and
wherein the anisotropic conductive material layer comprises:
a conductive portion corresponding to the convex portion, formed by having the conductive particles therein contacting each other thereby causing the conductive portion to be conductive at a vertical direction; and
an insulating portion corresponding to the concave portion, in which the conductive particles are substantially not in contact thereby causing the insulating portion to be insulative at a horizontal direction.

7. The system of claim 6, each LED further comprising an electrode structure formed over a top surface of the light-emitting epitaxial structure and having a projection at a normal direction corresponding to the concave portion of the conductive substrate.

8. The system of claim 6, wherein the patterned concave-convex structure of the conductive substrate comprises an array structure, and wherein all convex portions have upper surfaces at a same level.

9. The system of claim 6, wherein the anisotropic conductive material layer is conductive at the vertical direction relative to the front surface and insulative at the horizontal direction relative to the front surface.

10. The system of claim 6, wherein the light emitting epitaxial structure comprises a first conductive semiconductor layer, an active layer, and a second conductive semiconductor layer.

11. The system of claim 6, wherein the conduction portion passes through the convex portion of the conductive substrate to make the conductive particles contained therein contact with each other via pressing, and wherein the insulation portion fills in the concave portion of the conductive substrate.

12. The system of claim 6, wherein the anisotropic conductive material layer has a thickness of about 30 μm or higher.

13. The system of claim 12, wherein the anisotropic conductive material layer has a thickness of about 50 μm.

* * * * *